US009209759B2

(12) United States Patent
Moser et al.

(10) Patent No.: US 9,209,759 B2
(45) Date of Patent: *Dec. 8, 2015

(54) METHOD FOR OBTAINING FIELD STRENGTH INFORMATION

(75) Inventors: Helmut Moser, Heilbronn (DE); Daniel Moser, Korntal-Muenchingen (DE)

(73) Assignee: Atmel Corporation, San Jose, CA (US)

( * ) Notice: Subject to any disclaimer, the term of this patent is extended or adjusted under 35 U.S.C. 154(b) by 798 days.

This patent is subject to a terminal disclaimer.

(21) Appl. No.: 13/548,961

(22) Filed: Jul. 13, 2012

(65) Prior Publication Data

US 2013/0015840 A1 Jan. 17, 2013

Related U.S. Application Data

(63) Continuation of application No. 12/778,656, filed on May 12, 2010, now Pat. No. 8,233,867.

(60) Provisional application No. 61/177,812, filed on May 13, 2009.

(30) Foreign Application Priority Data

May 13, 2009 (DE) .......................... 10 2009 021 152

(51) Int. Cl.
   *G01R 29/08* (2006.01)
   *H03F 3/193* (2006.01)

(52) U.S. Cl.
   CPC ............ *H03F 3/193* (2013.01); *G07C 2209/63* (2013.01); *H03F 2200/294* (2013.01)

(58) Field of Classification Search
   CPC ...... G01R 33/07; G01R 15/20; G01R 31/025;
   G07C 2209/63; H03F 2200/294; H03F 3/193;
   G11C 11/22; H03G 3/345; H03K 5/08;
   H03K 5/1252; H03K 5/2418
   See application file for complete search history.

(56) References Cited

U.S. PATENT DOCUMENTS

| | | | | |
|---|---|---|---|---|
| 4,634,902 A | * | 1/1987 | Tanaka et al. | 327/310 |
| 5,239,701 A | * | 8/1993 | Ishii | 455/180.1 |
| 5,581,213 A | * | 12/1996 | Linder et al. | 330/282 |
| 5,999,803 A | * | 12/1999 | Kim | 455/226.2 |
| 6,356,475 B1 | * | 3/2002 | Tamura et al. | 365/145 |
| 6,922,553 B2 | | 7/2005 | Blatz et al. | |
| 7,082,287 B2 | * | 7/2006 | Hirama | 455/70 |
| 7,130,601 B2 | * | 10/2006 | Khorram | 455/226.2 |
| 8,233,867 B2 | * | 7/2012 | Moser et al. | 455/226.2 |

FOREIGN PATENT DOCUMENTS

EP    1 318 623    6/2003

* cited by examiner

*Primary Examiner* — Tung X Nguyen
*Assistant Examiner* — Alesa Allgood
(74) *Attorney, Agent, or Firm* — Fish & Richardson P.C.

(57) ABSTRACT

A method includes generating an input voltage for an operational amplifier from a received electromagnetic signal in a receiver unit by an input resistance and generating an output voltage by the operational amplifier by a fixed amplification factor. The input voltage is changed until the output voltage lies within a predefined interval that includes the value of the reference voltage. The input voltage is tapped at a divider node of a voltage divider. The gate voltage of the MOS transistor, operating within a nonlinear range and connected to the divider node, is changed to adjust the output voltage to the reference voltage such that a forward resistance of the transistor is changed nonlinearly. A field strength value received by the receiver unit is determined from a comparison of the value of the present gate voltage with quantities assigned to stored gate voltage values.

19 Claims, 2 Drawing Sheets

METHOD FOR OBTAINING FIELD STRENGTH INFORMATION

RELATED APPLICATIONS

This nonprovisional application is a continuation of U.S. application Ser. No. 12/778,656, now U.S. Pat. No. 8,232,876 filed 12 May 2010, by Helmut Moser et al. and entitled "Method for Obtaining Field Strength Information" and claims priority to German Patent Application No. DE 102009021152.7, filed May 13, 2009, by Helmut Moser et al. and entitled "Method for Obtaining Field Strength Information," and to U.S. Provisional Application No. 61/177,812, filed May 13, 2009, and entitled "Method for Obtaining Field Strength Information."

BACKGROUND OF THE INVENTION

1. Field of the Invention

The present invention relates to a method for obtaining field strength information and to a circuit arrangement.

2. Description of the Background Art

A method of this type is known from European Pat. No. EP 1 318 623 B1, which corresponds to U.S. Pat. No. 6,922,553, and which is incorporated herein by reference. Inter alia, a distance between the transmitter and receiver can be determined by means of the field strength information and used for detecting relaying. In general, a so-called "RSSI (Received Signal Strength Indicator)" value, which is proportional to the input signal of a receiving antenna, is determined from the received signal strength. In this regard, an input voltage for an operational amplifier is generated from a received electromagnetic signal by means of a receiver unit with an input resistance, and an output voltage is provided by the operational amplifier by means of a fixed amplification factor. The input voltage at the operational amplifier is changed until the output voltage lies within a predefined interval that includes the value of the reference voltage. To this end, the input voltage at the divider node of a voltage divider is tapped and, to adjust the output voltage to the reference voltage, the resistance of the voltage divider is changed by means of connection or disconnection of resistance branches connected to one another in a complex parallel circuit. Furthermore, the method is used to determine the distance of the receiver unit from a transmitting unit from the determined field strength values. Because of the fixedly predefined values of the resistance branches, the spatial resolution is very different depending on the distance; the spatial resolution is insufficient particularly at a short distance.

Inter alia, methods for obtaining field strength information are used in systems for contactless data transmission. An important field of application is identification systems, which are used, for example, for access control in a motor vehicle. Such identification systems consist of a base unit and one or more transponders; such methods are used for determining the field strength values or the distance preferably in transponders, which are designed, for example, as passive and as a result must draw the energy needed for operation by absorption from the electromagnetic field of the base station.

SUMMARY OF THE INVENTION

It is therefore an object of the present invention to provide a method by means of which the field strength of an input signal can be determined advantageously. A further object of the present invention is to provide a circuit arrangement for carrying out the method.

According to a first aspect of the present invention, a method is provided for obtaining field strength information from a received electromagnetic signal by means of a receiver unit, the method in which an input voltage for an operational amplifier is generated from the received signal in the receiver unit by an input resistance and an output voltage is generated by the operational amplifier by means of a fixed amplification factor, and the input voltage is changed until the output voltage lies within a predefined interval that includes the value of the reference voltage. In this regard, the input voltage is tapped at a divider node of a voltage divider and to adjust the output voltage to the reference voltage, the gate voltage of the MOS transistor, operating within a nonlinear range, preferably operating within the subthreshold range, and connected to the divider node, is changed in such a way that the forward resistance of the MOS transistor is changed in a nonlinear fashion depending on the gate voltage and the field strength value received by the receiver unit is determined from a comparison of the value of the present gate voltage with the quantities assigned to the gate voltage values in a memory means.

According to a second aspect of the invention, a circuit arrangement is provided to carry out the method, comprising a receiver unit for receiving an electromagnetic signal, an input resistance, realized as a voltage divider, having a divider node, whereby a voltage divider branch, connected to the divider node, comprises a MOS transistor linked to a reference potential, and whereby the MOS transistor has a control input for applying a gate voltage. Further, the circuit arrangement has an operational amplifier with an input and an output and a fixed amplification factor, whereby the input of the operational amplifier is connected to the divider node and the operational amplifier supplies an output voltage from a present input voltage. Furthermore, the output of the operational amplifier is linked to a control element, which provides a gate voltage for the MOS transistor, operating preferably in the subthreshold range, from a comparison of the output voltage with a reference voltage, and the MOS transistor has an operating point in the nonlinear range and is linked directly to the divider node and to the reference potential, so that a change in the input voltage to adjust the output voltage to the reference voltage is brought about exclusively by a change in the gate voltage of the MOS transistor.

An advantage of the method or the circuit arrangement is that the field strength of the particularly received electromagnetic signal can be determined without further calculations in a simple manner from a comparison of the applied gate voltage of a MOS transistor and stored field strength values, already assigned beforehand to the gate voltage. As a result, the method can be used for determining the spatial distance between the receiver unit and a transmitting unit, in that the field strength values, assigned in the value table to the respective gate voltage, are linked to a distance value. In this regard, a distance range within which data transmission is permitted can be established with the values from the value table. Further, the data rate can be increased with a decline in the distance. Further, because of the low power consumption, the method is especially suitable for obtaining field strength information in the case of transponders. The method of the invention is based, inter alia, on the fact that the field strength is linked to the distance between a receiving station and a transmitting station by a nonlinear functional relation and the nonlinear relation is inversely proportional in part to the nonlinear relation of a change in the forward resistance of a MOS transistor, operating within the nonlinear range, preferably in the "subthreshold" range. As a result, both nonlinear dependences are compensated in part, so that the gate voltage is increased or reduced linearly with rising values or declining values of the received field strength or the distance, until the output voltage of the operational amplifier lies within a predefined interval around the reference voltage. Tests by the applicant have shown that the level of the gate voltage in a first approximation is proportional to the logarithm of the distance. Because the amplification of the operational amplifier remains constant, the output voltage of the operational amplifier has a fixed ratio to the input voltage. As a result, the amplification is not increased either at low or at high input voltages and the ratio of the signal voltage to the noise voltage remains low over the entire amplification range. Another important advantage is that, because of the linear dependence of the values of the gate voltage to the distance, there is a uniform spatial resolution by means of the method of the invention both at small distances to the transmitting station and at great distances to the transmitting station.

Further, particularly with varying signal levels, a rapid turn-on and turn-off transient behavior at the output of the operational amplifier is achieved, because the output voltage and the input voltage of the operational amplifier fluctuate only to a minor extent and the capacitances present at the input or output of the operational amplifier are not recharged and the power consumption is reduced. In particular, in the case of pulse-pause modulated signals, the field gaps can be reduced by the short turn-on and turn-off transient behavior and the data rate increased. Another advantage of the fixed amplification factor is that in the case of the operational amplifier, the amplification can be adjusted precisely with a low current consumption by means of a high-impedance negative feedback. Another advantage of the method is that the nonlinear change in the resistance value of an individual resistance, which is preferably formed as an individual MOS transistor, is sufficient for regulating the input voltage present at the operational amplifier. In contrast, a particular advantage of the MOS transistor in comparison with a bipolar transistor is that the gate of the MOS transistor can be controlled virtually without loss and at low received field strengths a circuit formed in such a way requires little power to determine the received field strength. Specifically in circuits operating passively, i.e., those that draw the needed power exclusively from the electromagnetic field of a transmitting station, this is an important advantage in order to increase the communication range between [sic] a receiver operating according to the method of the invention.

Further, it is advantageous to supply the input voltage to the operational amplifier from a divider node of an input resistance realized as a voltage divider and hereby to change only the single resistance of the voltage divider part connected to a reference potential.

According to an embodiment, the gate voltage of the MOS transistor can be generated by means of a controllable current source and a controllable current sink, in that a storage element connected to the gate of the MOS transistor is discharged or charged. By means of the storage element, which is preferably realized as a capacitor, due to the integrating property of the capacitor the gate voltage can be changed continuously in that the capacitor is charged by the current source or discharged by the current sink. To this end, the current source or the current sink is controlled by a control unit, as a function of the result of the comparison of the output voltage, present at the control unit, of the operational amplifier with the reference voltage present at the control unit.

In another embodiment, to adjust the operating point or the gate voltage of the MOS transistor, the storage element can be supplied with current from a constant current source. The voltage level of the capacitor and thereby the operating point of the MOS transistor can be adjusted by the constant current source, without currents from the controllable current source or sink being required. In another preferred refinement, the storage element can be discharged by a switching means, preferably realized as a MOS transistor, to be able to adjust rapidly specifically defined voltage conditions or great fluctuations in the received field strength.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
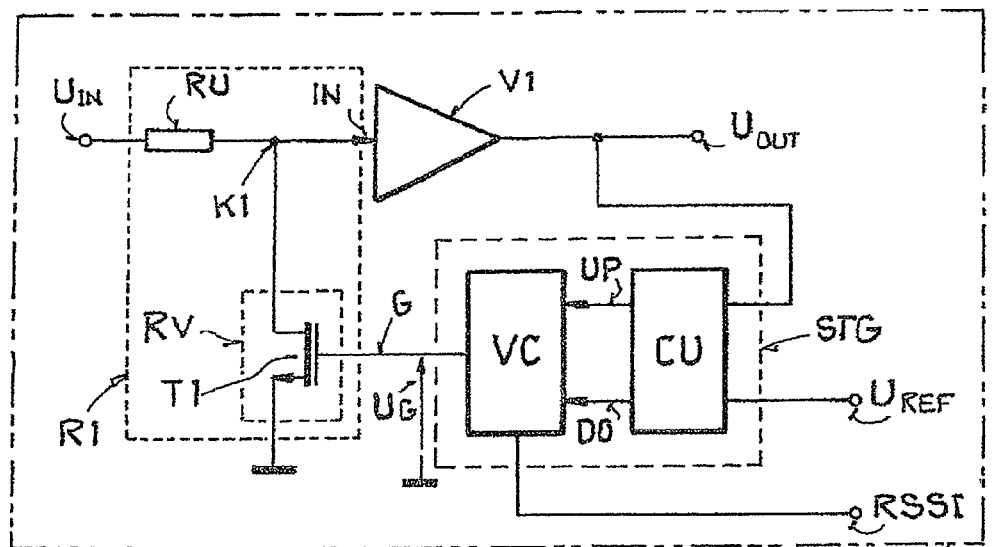
FIG. 1 shows a receiver unit with an amplifier circuit with a voltage divider in which the forward resistance of a MOS transistor is changed at the input by means of a control element.

The task of the receiver unit SEI, shown in FIG. 1, with an internal circuit arrangement is to amplify an input signal UIN, which has an alternating voltage form and is proportional to the field strength of an electromagnetic signal received by a receive antenna (not shown), by means of an operational amplifier V1 by a fixed factor and hereby to hold the output signal UOUT within a predefined interval by means of a control element STG, which changes the resistance value of an input resistance R1, realized as a voltage divider. The circuit arrangement will be described in greater detail below.

The voltage divider consists of a resistor RU and a MOS transistor T1 linked to a reference potential and realized as a controllable resistance RV. Further, the voltage divider has a node K1, which is connected to the noninverting input of the operational amplifier V1 and to a terminal of MOS transistor T1. Operational amplifier V1 has a fixed amplification factor. The control element STG is connected by means of a control line G, which provides a gate voltage UG, to the control input or gate of MOS transistor T1, linked to the reference potential, and has an input at which a voltage UREF is present. Further, the control element has an output for outputting a voltage value RSSI. Control element STG has a control unit CU and a voltage generating unit VC. Control unit CU, at which the output voltage UOUT and the reference voltage UREF are present, is linked via a control line UP and a control line DO to voltage generating unit VC. Further, voltage generating unit VC is linked to control line G and to the output for outputting the voltage value RSSI.

The principle of operation will be described below. The input voltage IN from the input signal UIN is supplied by means of resistor R1 to the operational amplifier V1, whereby the voltage level at the node K1 is determined by the resistance RV or the forward resistance of the MOS transistor T1. The control element STG generates a voltage interval around the present reference voltage UREF. If the output voltage UOUT is above the voltage interval, the gate voltage of the MOS transistor T1 is increased by the control element STG by means of the control line G. If the output voltage UOUT is below the voltage interval, the gate voltage UG of the MOS transistor T1 is reduced by the control element STG and subsequently its forward resistance increased, so that the voltage drop at transistor T1 and as a result the input voltage IN of transistor T1 are increased. Further, the gate voltage UG applied by the control element STG is supplied by means of the voltage value RSSI to the processor (not shown). The processor then determines the received field strength value or the distance to the transmitting station from the voltage value RSSI, in that a field strength value or distance value, preferably stored in a memory, is read out of the voltage value RSSI.

Figure 2:
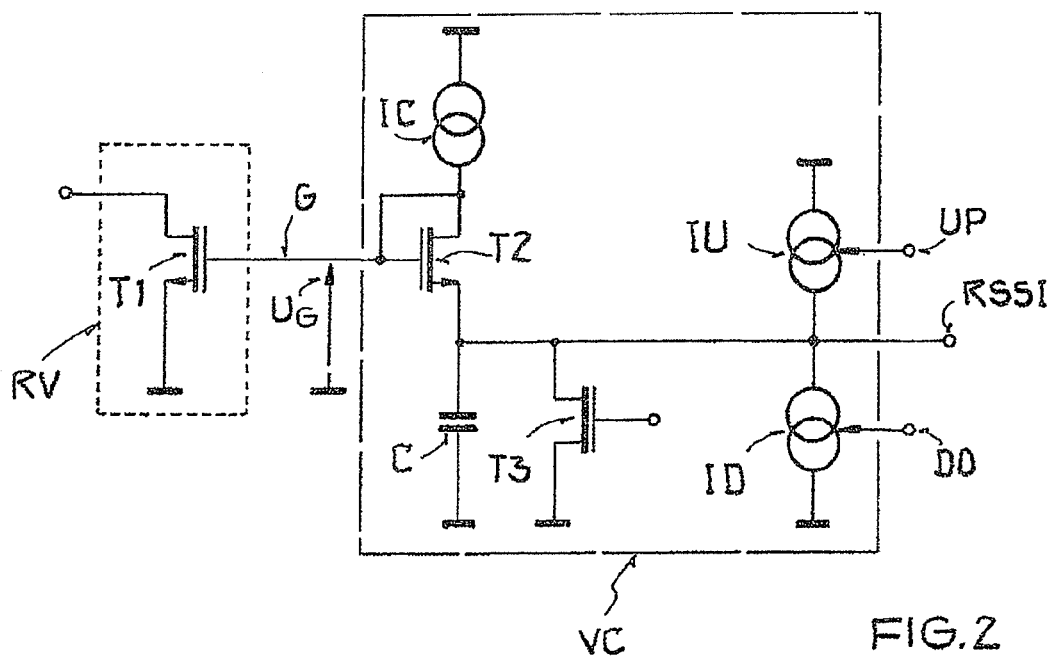
FIG. 2 shows a control circuit for generating a gate voltage of the MOS transistor of FIG. 1.

An exemplary embodiment of the voltage generating unit VC from FIG. 1 is shown in FIG. 2. The explanations provided in regard to FIG. 1 apply to the external wiring of the voltage generating unit VC. The structure of the voltage generating unit VC, used to generate a gate voltage UG, is described in greater detail below. A constant current source IC, linked with the reference potential, is connected to the gate of MOS transistor T1 by means of control line G. The constant current source IC is linked in a series connection to transistor T2 linked as a diode. Transistor T2 is linked in a series connection to a capacitor C connected to the reference potential. Further, a transistor T2, a controllable current source IU, and a controllable current sink ID are connected parallel to capacitor C. The control input of current source IU or the control input of current sink ID is connected to the line UP or to the line DO.

The principle of operation will be described below. The gate voltage UG is applied at the gate of transistor T1 by means of the constant current source IC. At the same time, the voltage value RSSI is determined at capacitor C via transistor T2, provided capacitor C is not discharged more rapidly by transistor T3. The value of the voltage RSSI and the level of the gate voltage of transistor. T1 are determined from the ratio of the current supplied by the constant current source IC and the current removed by transistor T3—i.e., the operating point or the forward resistance of transistor T1 are adjusted—, with the assumption that the current source IU and the current sink ID do not impress any currents. The level of the voltage RSSI in this regard is smaller by the value of the voltage drop across transistor T2 than the level of the voltage present at the gate of transistor T1. The voltage level can be adjusted in each case to the desired value by means of the control via control lines UP or DO of the current source IU or the current sink ID. After this, the set level is held by the circuit for adjusting the operating point. In this case, the forward resistance of transistor T1 declines with an increasing gate voltage UG and as a result the input voltage IN or the output voltage UOUT of operational amplifier V1 is reduced. The applied voltage value RSSI or the distance is therefore directly proportional to the received field strength or the applied input voltage UIN.

Figure 3:
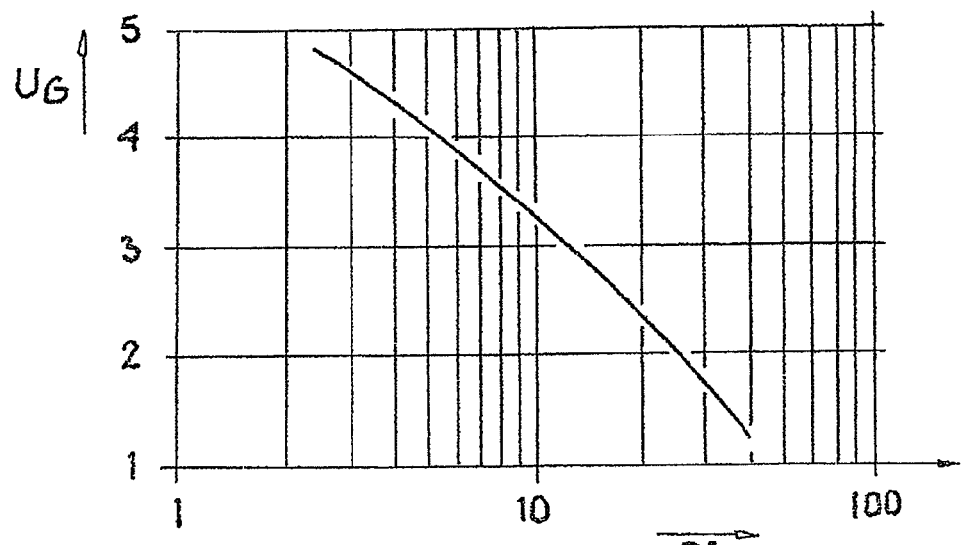
FIG. 3 shows a schematic illustration of the gate voltage as a function of the distance.

The relation of a gate voltage UG present at transistor T1 versus the logarithm of the distance DI between a transmitting station and a receiver is plotted in FIG. 3; in this case, the labeling of the axes is selected purely arbitrarily. According to the diagram, in the simple logarithmic plot, a virtually linear course results between the level of the gate voltage UG and the distance, i.e., the distance between a base station and a transponder. It is possible as a result to determine the distance via another value range by means of a linear change in the gate voltage in a simple and reliable manner. This is of advantage particularly during use of the distance determination in the area of security, i.e., during the detection of relaying.

Figure 4:
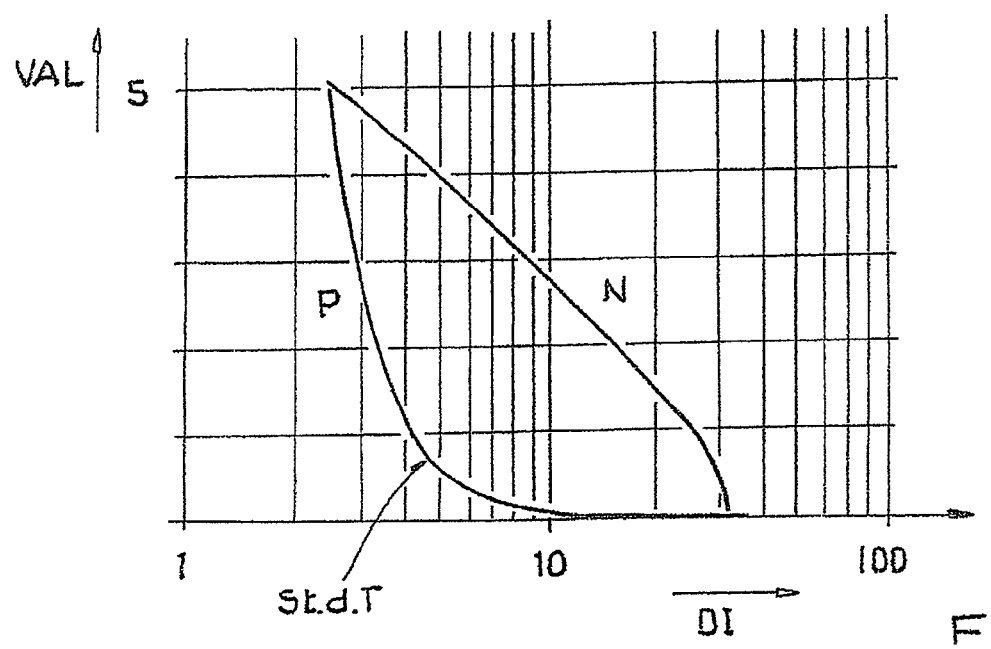
FIG. 4 shows a schematic comparison of the spatial resolution according to the method of the invention and the state of the art.

In FIG. 4, in a linear diagram, the distance of two control points VAL according to the present invention is plotted along the Y-axis versus the logarithm of the distance DI between a transmitting station and a base station along the X-axis; in this case, the values on the axes are selected purely arbitrarily. The relation between the distance of two gate voltage values and the distance and hereby the spatial resolution according to the present invention is illustrated by means of a line N, whereas the course of the spatial resolution according to the state of the art, for example, known from the patent publication EP 1 318 623 B1, is shown by means of a curve P. In contrast to the prior art, according to the present invention the determination of the distance at greater distances as well becomes possible reliably and with a greatly improved value density. The latter is possible only very inaccurately in the prior art.

In the exemplary embodiments provided thus far, the depicted MOS transistors can be replaced by bipolar transistors. It is a disadvantage that this type of embodiment with bipolar transistors has an increased current consumption and reduces the communication range in passive transponders.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for obtaining field strength information, comprising:
    storing, in a memory, an association between field strength values and predefined gate voltages;
    applying, by an input resistance element, a resistance value to an input signal to generate an input voltage;
    amplifying the input voltage by an operational amplifier to generate an output voltage;
    determining, by a control element, that the output voltage is outside a voltage interval associated with a reference voltage;
    in response to determining that the output voltage is outside the voltage interval, changing a gate voltage applied to the input resistance element to adjust the resistance value applied to the input signal in a non-linear manner to result in an adjusted output voltage by the operational amplifier; and
    in response to determining that the adjusted output voltage is within the voltage interval, determining, from a table, a field strength of the input signal based on the gate value applied to the input resistance element and a stored association between the field strength values and the predefined gate voltages.

2. The method according to claim 1, wherein amplifying the input voltage comprises amplifying the input voltage by a fixed amplification factor.

3. The method according to claim 1, wherein:
    determining that the output voltage is outside the voltage interval associated with the reference voltage comprises determining that the output voltage is above the voltage interval; and
    changing the gate voltage applied to the input resistance element to adjust the resistance value applied to the input signal comprises increasing the gate voltage to decrease the resistance value applied to the input signal.

4. The method according to claim 1, wherein:
  determining that the output voltage is outside the voltage interval associated with the reference voltage comprises determining that the output voltage is below the voltage interval; and
  changing the gate voltage applied to the input resistance element to adjust the resistance value applied to the input signal comprises reducing the gate voltage to increase the resistance value applied to the input signal.

5. The method according to claim 1, wherein applying, by the input resistance element, the resistance value to the input signal comprises:
  tapping the input voltage of a divider node of the input resistance element; and
  applying the gate voltage to a MOS transistor of the input resistance element.

6. The method according to claim 5, wherein applying the gate voltage to the MOS transistor changes a forward resistance of the MOS transistor in a nonlinear manner, the forward resistance applied to the input voltage at the divider node.

7. The method according to claim 5, further comprising generating the gate voltage via a controllable current source and a controllable current sink such that a storage element connected to a gate of the MOS transistor is discharged or charged.

8. The method according to claim 1, wherein, to adjust the gate voltage applied to the input resistance element, a storage element comprising a capacitor is supplied with current from a constant current source.

9. The method according to claim 8, wherein the storage element is discharged via a switch.

10. A receiver unit comprising:
  a memory storing an association between field strength values and predefined gate voltages;
  an input resistance element configured to apply a resistance value to an input signal to generate an input voltage;
  an operational amplifier configured to receive the input voltage and amplify the input voltage to generate an output voltage; and
  a control element configured to:
    determine that the output voltage is outside a voltage interval associated with a reference voltage; and
    in response to determining that the output voltage is outside the voltage interval, change a gate voltage applied to the input resistance element to adjust the resistance value applied to the input signal in a non-linear manner to result in an adjusted output voltage by the operational amplifier; and
    in response to determining that the adjusted output voltage is within the voltage interval, determining a field strength of the input signal based on the gate value applied to the input resistance element and a stored association between the field strength values and predefined gate voltages.

11. The receiver unit according to claim 10, wherein the operational amplifier is configured to amplify the input voltage by a fixed amplification factor.

12. The receiver unit according to claim 10, wherein:
  when determining that the output voltage is outside the voltage interval, the control element is configured to determine that the output voltage is above the voltage interval; and
  when changing the gate voltage applied to the input resistance element, the control element is configured to increase the gate voltage to decrease the resistance value applied to the input signal.

13. The receiver unit according to claim 10, wherein:
  when determining that the output voltage is outside the voltage interval, the control element is configured to determine that the output voltage is below the voltage interval; and
  when changing the gate voltage applied to the input resistance element, the control element is configured to decrease the gate voltage to increase the resistance value applied to the input signal.

14. The receiver unit according to claim 10, wherein, when applying the resistance value to the input signal, the input resistance element is configured to:
  tap the input voltage of a divider node of the input resistance element; and
  apply the gate voltage to a MOS transistor of the input resistance element.

15. The receiver unit according to claim 14, wherein applying the gate voltage to the MOS transistor changes a forward resistance of the MOS transistor in a nonlinear manner, the forward resistance applied to the input voltage at the divider node.

16. The receiver unit according to claim 14, further comprising:
  a controllable current source coupled to a gate of the MOS transistor, the controllable current source configured to generate the gate voltage; and
  a storage element configured to be charged by the controllable current source or discharged by a current sink.

17. The receiver unit according to claim 10, wherein, to adjust the gate voltage applied to the input resistance element, a storage element comprising a capacitor is supplied with a current from a constant current source.

18. The receiver unit according to claim 17, wherein the storage element is discharged via a switch.

19. A receiver unit comprising:
  a memory storing an association between field strength values and predefined gate voltages;
  a voltage divider configured to apply a resistance value to an input signal to generate an input voltage, the voltage divider comprising:
    a resistor configured to provide a resistance;
    a MOS transistor configured to generate a forward resistance; and
    a divider node disposed between the resistor and the MOS transistor, the divider node coupled to an input of an operational amplifier and a terminal of the MOS transistor, wherein a voltage level of the input voltage at the divider node is determined by at least one of the resistance provided by the resistor and the forward resistance of the MOS transistor;
  the operational amplifier configured to receive the input voltage and amplify the input voltage using a fixed amplification factor to generate an output voltage; and
  a control element configured to:
    determine that the output voltage is outside a voltage interval associated with a reference voltage; and
    in response to determining that the output voltage is outside the voltage interval, change a gate voltage applied to the MOS transistor to adjust the resistance value applied to the input signal in a non-linear manner to result in an adjusted output voltage by the operational amplifier; and
    in response to determining that the adjusted output voltage is within the voltage interval, determining a field strength of the input signal based on the gate value applied to the MOS transistor and a stored association between the field strength values and predefined gate voltages.

* * * * *

UNITED STATES PATENT AND TRADEMARK OFFICE
CERTIFICATE OF CORRECTION

| | |
|---|---|
| PATENT NO. | : 9,209,759 B2 |
| APPLICATION NO. | : 13/548961 |
| DATED | : December 8, 2015 |
| INVENTOR(S) | : Helmut Moser and Daniel Moser |

It is certified that error appears in the above-identified patent and that said Letters Patent is hereby corrected as shown below:

Specification

Column 1, Line 7; Delete "8,232,876" and insert -- 8,233,867 --, therefor.

Column 4, Line 38; Delete "SEI," and insert -- SE1, --, therefor.

Signed and Sealed this
Fifteenth Day of March, 2016

Michelle K. Lee
*Director of the United States Patent and Trademark Office*